United States Patent [19]
Gillan et al.

[11] Patent Number: 4,827,378
[45] Date of Patent: May 2, 1989

[54] JACK COAXIAL CONNECTOR EMI SHIELDING APPARATUS

[75] Inventors: Robert L. Gillan, Garland; David E. Kosanda, Richardson, both of Tex.

[73] Assignee: Rockwell International Corporation, El Segundo, Calif.

[21] Appl. No.: 206,781

[22] Filed: Jun. 15, 1988

[51] Int. Cl.[4] .............................................. H05K 9/00
[52] U.S. Cl. .................................... 361/424; 333/12; 174/35 C; 439/620; 361/395
[58] Field of Search ................ 361/111, 380, 392–395, 361/399, 400, 424; 333/185, 12; 174/35 R, 35 C; 439/620, 607, 63; 455/300, 301

[56] References Cited

U.S. PATENT DOCUMENTS

| | | | |
|---|---|---|---|
| 4,641,224 | 2/1987 | Reimer | 174/35 R |
| 4,713,633 | 12/1987 | Saito et al. | 361/424 |
| 4,737,597 | 4/1988 | Tomiya | 174/35 R |
| 4,740,794 | 4/1988 | Phillips | 455/300 |
| 4,747,019 | 5/1988 | Ito | 361/424 |
| 4,773,880 | 9/1988 | Sutton | 439/620 |

*Primary Examiner*—Gerald P. Tolin
*Attorney, Agent, or Firm*—Bruce C. Lutz; V. Lawrence Sewell; H. Fredrick Hamann

[57] ABSTRACT

The present invention accomplishes the desirable end result of capacitively coupling the outer shield portion of a coaxial jack connector to an outer panel or chassis while having the jack connector physically and directly electrically connected to a back plane or motherboard within the chassis. The connection to the outside environment is via an opening in the outer or shielding chassis through which the mating portion of the jack connector is passed. A prior art approach used a capacitively connected coaxial jack connector at the panel and a cable connected internal to the chassis from this panel connector to a normal coaxial connector on the back plane. The present invention eliminates two of the three components of the prior art approach.

3 Claims, 2 Drawing Sheets

JACK COAXIAL CONNECTOR EMI SHIELDING APPARATUS

THE INVENTION

The present invention is generally related to electronics and is more specifically related to the problem of preventing EMI signal radiation from an electronic package and its connected coaxial cables while maintaining the capability of easily removing the chassis cover for access to that circuitry.

BACKGROUND

As signal frequencies used in electronic modules get higher and higher, there are more problems with radio frequency interference (RFI) and electromagnetic interference (EMI). To counteract the emission of these signals from electronic packages, the packages are carefully shielded. However, it is still necessary to transfer signals to and from the electronic circuitry within an electronic package. It may be noted that grounding the shield to the chassis is typically not acceptable due to ground loops in the signal path. A prior art coaxial cable approach of accomplishing such transfer of signal information without compromising the integrity of the shield is to mount an insulated coaxial jack connector to the outer chassis and have a cable connected internal to the chassis from this outer chassis jack to a further coaxial connector on the back plane. The coaxial connector at the panel was then capacitively connected to the outer chassis to prevent the transmission of any direct current voltages to the chassis while placing the ground of connected coaxial cable and the chassis at the identical alternating frequency potential due to the capacitive action. The negative aspects of this approach to solving the problem is the number of components involved and if there are a plurality of coaxial jack connectors, an additional complicating factor is the number of coaxial connectors which must be disconnected to remove the cover of the chassis to gain access to the back plane or other electronic circuitry within the chassis.

To attain signal emission levels which meet present FCC requirements, one is forced to capacitively connect the shell of the coaxial connector to the outside chassis rather than to some other ground internal to the enclosure such as a back plane in close proximity to the chassis. Therefore, the prior art approach of capacitively grounding a coaxial connector to the back plane can no longer be used.

To attempt to solve the FCC requirement problem, some manufacturers are presently marketing very expensive and specialized DC insulated and RF signal capacitively coupled coaxial cable jacks which mount on the chassis.

In summary, the prior art approaches have interfered with accessibility of the electronics within an enclosure, cost too much in terms of cost of components or the cost of assembly in manufacture create component inventing problems, or have been inadequate in control of EMI emissions so that they will not meet present day standards.

The present invention overcomes prior art limitations by utilizing an inexpensive and normally inventoried standard coaxial jack mounted on a back plane which is capacitively coupled to the outer chassis by using a capacitively coupled spring contact which is electrically and mechanically attached to the capacitors mounted on the outer chassis and which provides spring contact to the coaxial connector when the outer chassis is assembled to provide an integral enclosure. The mating portion of the coaxial jack extends through an opening in the outer chassis with the spring contact completely surrounding the opening. Although the opening is typically too small to allow significant emissions, the presence of the spring contact provides a further impediment to prevent EMI emissions through the opening It is thus an object of the present invention to provide an improved approach to solving the problem of preventing EMI emissions from an electronic module within a chassis at a reasonable cost for parts both for manufacturing assembly time and time required to disassemble for inspection or repair.

Other objects and advantages of the present invention will be apparent from a reading of the specification and appended claims in conjunction with the drawings wherein:

DETAILED DESCRIPTION

Figure 1:
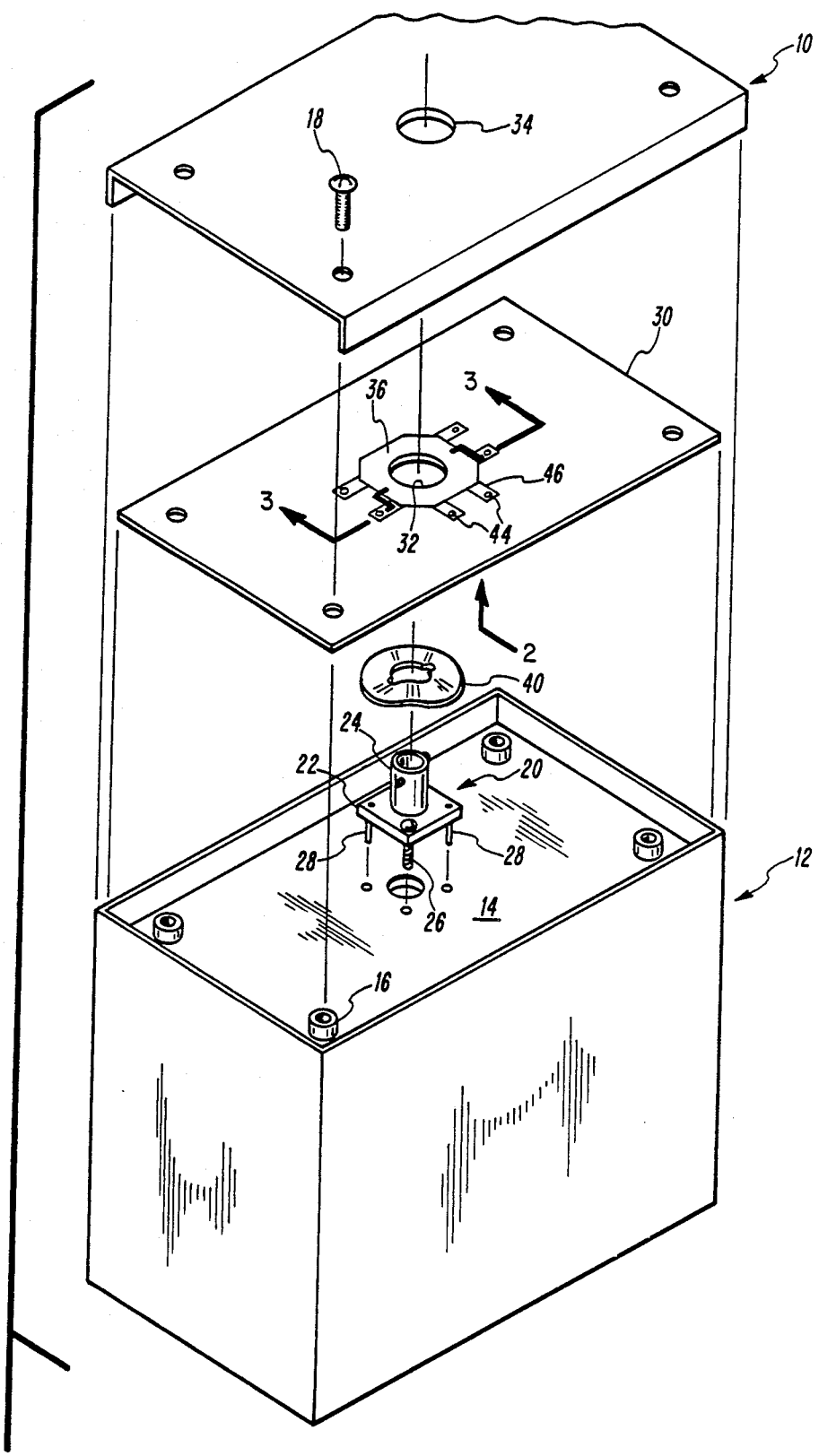
FIG. 1 is an exploded isometric view of the components comprising the invention.
Figure 2:
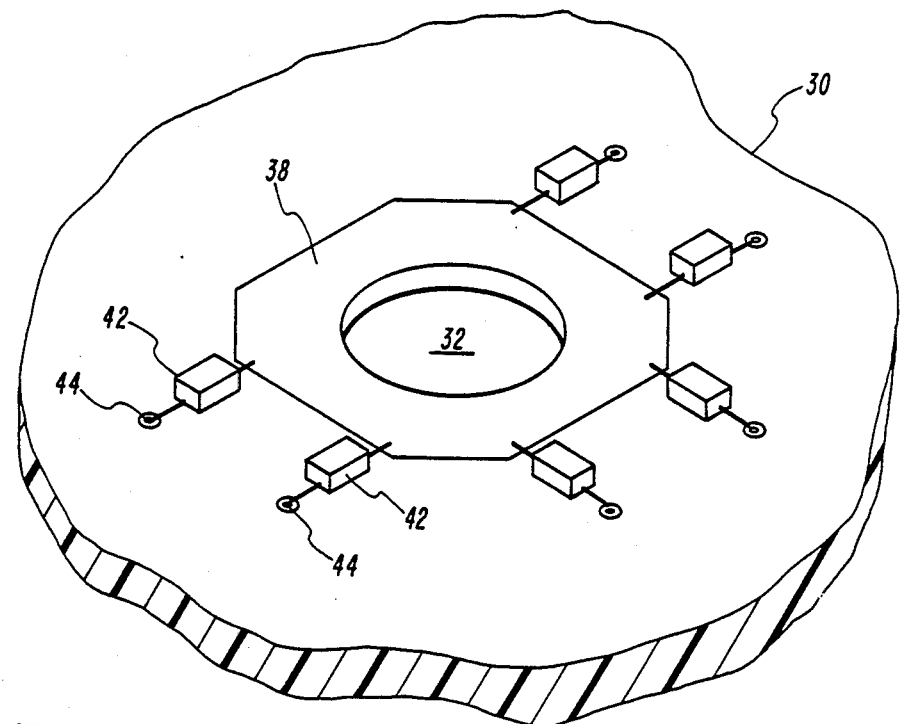
FIG. 2 is an isometric detail of a portion of FIG. 1.

In FIG. 1 a chassis or container is shown in two parts with a cover designated as 10 and the remainder of the container designated as 12. Within the container or chassis 12 is a plurality of electronic components with a back plane printed circuit board illustrated as 14. Although not illustrated as such, back plane 14 would have many electrical components thereon and is further typically connected to many other circuit boards or other electronic components within box 12. Threaded receptacles such as 16 are shown on the back plane 14 for interacting with fastening means such as a screw 18 which will hold the cover 10 securely in place to complete the enclosure of the electronics within the combination enclosure 10 and 12. A coaxial jack connector is designated as 20 and has a base portion 22, a mating portion 24, a mounting post such as designated with the designator 26 and electrical connections such as 28. The projections 26 and 28 are used to mechanically and electrically connect the jack 20 to the circuit board 14. A further printed circuit board 30 is shown between cover 10 and the back plane 14. An opening 32 on printed circuit board 30 is aligned with a similar opening 34 within cover 10 and both of which are aligned with the mating portion 24 of jack 20. A contact area 36 surrounding the opening 32 provides contact with the cover 10. Although not shown in the drawing, one embodiment of the invention contained a ground plane on the entire upper surface and made even more positive electrical contact with the cover though the use of further fastening means connecting the ground plane and the board 30 directly to the cover 10. A similar contact 38 which is shown in FIG. 2, is on the opposite side of contact 36 on board 30 and contact is made between this contact area 38 and the jack 20 by a curved or warped spring type washer 40. When the cover 10, printed circuit board 30 and the washer 10 are assembled in an operating condition, the spring washer 40 provides positive electrical contact between the base 22 of jack 20 and the contact area 38 of printed circuit board 30. The spring washer 40 also serves to reduce the emission of EMI signals from the opening 34 of the chassis cover 10.

FIG. 2 illustrates a view of printed circuit board 30 from the underside, and in addition to the previously mentioned contact area 38, illustrates a plurality of capacitors each designated as 42 which are connected between contact area 38 and a plated through hole such as 44 which provides electrical contact to the opposite side of the printed circuit board 30 and thus, to the contact 36. The plated through holes 44 are connected to the contact area 36 of FIG. 1 via conductive paths such as 46. As shown, the two contact areas 36 and 38 are connected to each other via the capacitor 42, plated through hole 44 and the return path 46. Only a few of the plated through holes and capacitors are specifically numbered but all are representative. It should be noted that while the capacitors are ideally uniformly located around the opening, space and location requirements in one embodiment of the invention required the use of the non-symmetrical version shown in FIG. 2 for layout of the capacitors. It should also be noted that while the invention will operate with some success with only a single capacitor of the same total capacitance as all o& the capacitors 42, the reduction of stray RF signals from the chassis was maximized by using a plurality. Measurements performed on test versions provided perceptively different measurable levels with different numbers of capacitors until the quantity of capacitors reached at least six. After that, the reduction in signal emission was not distinctly measurable.

Figure 3:
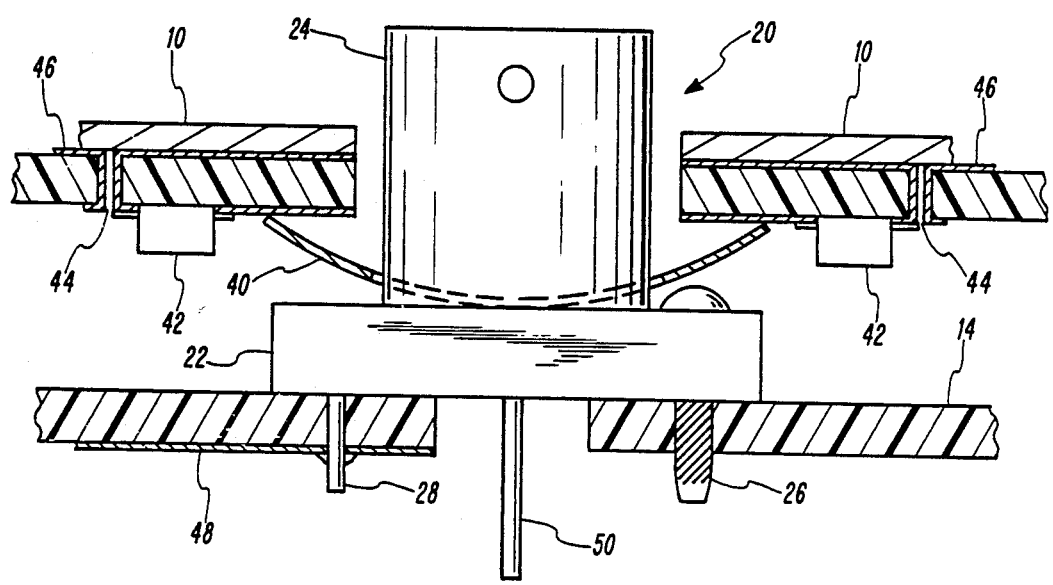
FIG. 3 is a cross section presentation of another portion of FIG. 1.

In FIG. 3 the same numbers are utilized as have been previously assigned in FIGS. 1 and 2. As shown, the post 28 is electrically connected to a printed circuit lead 48 in FIG. 3. A central electrical connection 50 for jack 20 is shown as not being connected to anything. While typically the center connection would be connected to a further electrical lead on the printed circuit board 14, such a drawing presentation was deemed difficult to provide. In any event, an alternative connection would be a cable with the central conductor of the cable being connected to terminal 50 and its outside coaxial shielding conductor being connected to lead 28. The post 26 is used for mounting purposes in a press fit environment and is thus in existence merely for mechanical considerations. However, the ground lead 48 can extend to the other side of printed circuit board 14 and provide a further grounding electrical contact area with the base 22 of jack 20.

OPERATION

The FCC has certain standards and requirements regarding the emission of signals from electronic boxes and attached signal carrying cables. These require that the emission of electromagnetic and RF signals be no greater than a predetermined amount. In the case of coaxial cable signals, this could be accomplished by solidly connecting the coaxial cable ground conductor to a properly grounded chassis and eliminating all RF signals from the cable cover in this way. However, some customers such as telephone companies require that the coaxial cable ground conductors be DC isolated so that they can perform their own approaches to grounding techniques. Thus, to comply with both FCC requirements and telephone company requirements, the coaxial cables leaving electronic equipment must be grounded to high frequency alternating signals but not be grounded for DC signals. The RF signals which need to be grounded, are not merely the cable signal frequencies, but all kinds of harmonics that are generated internal to the electronic module contained within the chassis. In one embodiment of the invention, the signals appearing on the coaxial cable, lead 50, were only 45 megahertz. However, harmonics of significant amplitudes were generated up to 500 megahertz within the electronic package. Thus, any openings such as that opening 34 in the chassis cover, needs to be of such a size that the DC grounding of the cover has no opening larger than that required to prevent the passage of a 500 megahertz signal.

As previously mentioned, such a connection can be obtained by various prior art approaches if the telephone company requirement of DC isolation is not involved. With the telephone company requirement and the FCC requirement, the only known prior art approach which is successful is an expensive and insulated coaxial jack physically mounted to the outside chassis which provides capacitive coupling for RF shorting to the case while still maintaining DC isolation.

The present invention is an attempt to reduce inventory by having only a single standard jack connector and to reduce costs by using this inexpensive connector with the printed circuit board 30 and the associated contact 40 and grounding capacitor 42. While such a savings would not be significant if only a single coaxial connector were involved, many types of electronic packages destined for telephone company use, have more than ten coaxial cables connected thereto. Thus, a single printed circuit board having the function of board 30 may potentially be used with many coaxial cable jacks where the only additional cost is that of the attached capacitors and spring contacts.

While the contact 40 would most desirably provide continuous contact with the entire base of jack 22 and the entire surface of contact area 38, the two point contact of the washer 40 when other than fully compressed, still provides performance that meets present FCC and telephone company standards.

It should be realized that prior art attempts to ground the jack 22 to the motherboard 14 have provided less than optimal results and, in fact, did not meet with FCC requirements. Thus, it is mandatory that the RF grounding be accomplishing as close to the chassis 10 as is possible for maximum signal emission control.

It may also be noted that the clearance between mating portion 24 and the printed circuit board 30, as represented by the drawing, appears to be fairly small. However, this opening is of whatever size is necessary to accommodate the mating coaxial connector used with the coaxial cable. Such clearances are clearly within the opening size that will prevent emission of 500 megahertz harmonic signals.

SUMMARY

The present invention accomplishes the desirable result of allowing access to the motherboard such as 14 and the electronic circuitry contained thereon upon a simple removal of cover 10 while still maintaining the requirement of RF grounding the coaxial jacks, such as 20, to the chassis cover 10 through the use of a contact combination comprising the washer 40, the contacts 36 and 38 and the associated grounding or coupling capacitors 42. Such contact is only made when the cover 10 and the associated components are in place and the enclosure comprising parts 10 and 12 are a unitary item.

While we have described a single embodiment of the inventive concept, we wish to be limited not to the specific embodiment shown, but only by the scope of the appended claims wherein we claim:

1. Apparatus for RF grounding the outer shield of a coaxial cable at the outer chassis of an electronic package having at least one standard coaxial cable connector with a base and a projecting portion which will extend through an opening in the chassis to permit the connection of a complementary coaxial cable connector to the package for minimizing EMI signal leakage from the package comprising, in combination:
   circuit board means, having first and second sides with an opening extending from said first side to said second side, with first contact means surrounding said opening on said first side and second contact means on said second side;
   distributed capacitive means connected between said first and second contact means;
   removable outer chassis means comprising a part of a complete outer chassis for an electronic package including an opening for passage of a portion of a coaxial cable connector jack of said electronic package;
   means for attaching said board means to said outer chassis means wherein said openings in said board and said chassis means are aligned and there is electrical contact between said first contact means of said circuit board means and said chassis means; and
   spring contact means for placement around said projecting portion of said standard cable connector and for making electrical contact between said second contact means of said circuit board means and said base of said cable connector.

2. Apparatus for RF grounding the outer shield of a shielded cable jack at the outer chassis of an electronic package to minimize EMI signal leakage while facilitating the easy removal of said outer chassis to provide access to underlying circuitry comprising, in combination:
   removable outer chassis means including at least one opening for passage of a mating portion of a coaxial jack;
   spring loaded contact means located adjacent an interior surface of said outer chassis means and circumscribing said at least one opening in said outer chassis means and insulated from direct contact with said chassis means;
   means for capacitively connecting said spring loaded contact means to said chassis to provide an effective electrical short to RF signals; and
   remaining chassis electronic circuit enclosure means for cooperating with said removable outer chassis means to complete a container and including an electronic module means having a coaxial cable jack connector with base and mating portions situated such that the mating portion is aligned with said at least one opening and whereby the mating portion of the jack projects through said at least one opening when said outer chassis means is in place and attached to said remaining chassis enclosure means.

3. Apparatus for RF grounding the outer shield of a shield RF cable jack to the outer chassis of an electronic package to minimize EMI signal radiation comprising, in combination:
   outer chassis means with at least one opening for passage of a mating coaxial jack;
   coaxial jack means, including base and mating portions, means situated adjacent said outer chassis means with said mating portion aligned with and extending through said opening in said chassis means;
   circuit board means attached to said outer chassis means and located between said chassis means and said jack means, an opening in said circuit board means coinciding with said at least one opening in said chassis means;
   a plurality of capacitive elements mounted on said circuit board means and distributed around said at least one opening; and
   spring loaded contact means for providing electrical contact between said outer chassis means and the base portion of said coaxial jack means through said plurality of capacitive elements whereby an effective short to RF signals is provided between said chassis means and said mating portion of said jack means and thus of any attached coaxial cable.

* * * * *